(12) United States Patent
Rai

(10) Patent No.: US 7,629,859 B2
(45) Date of Patent: Dec. 8, 2009

(54) INTEGRATED RESONANCE CIRCUIT

(75) Inventor: Samir El Rai, Duisburg (DE)

(73) Assignee: Atmel Duisburg GmbH, Duisburg (DE)

( * ) Notice: Subject to any disclaimer, the term of this patent is extended or adjusted under 35 U.S.C. 154(b) by 111 days.

(21) Appl. No.: 11/798,917

(22) Filed: May 17, 2007

(65) Prior Publication Data
US 2008/0001680 A1    Jan. 3, 2008

(30) Foreign Application Priority Data
May 17, 2006    (DE) ................ 10 2006 023 353

(51) Int. Cl.
*H03B 5/08* (2006.01)
(52) U.S. Cl. .................. 331/167; 331/117 R; 331/60
(58) Field of Classification Search ............ 331/117 R, 331/117 FE, 167, 180 C, 168, 110, 113 R, 331/36 C, 177 V, 182, 60
See application file for complete search history.

(56) References Cited

U.S. PATENT DOCUMENTS

| 5,561,398 A | 10/1996 | Rasmussen | |
| 6,097,258 A * | 8/2000 | Van Veenendaal | ...... 331/117 R |
| 6,628,174 B2 * | 9/2003 | Imaoka et al. | ......... 331/107 SL |
| 6,911,870 B2 * | 6/2005 | Gierkink et al. | ............... 331/46 |
| 2004/0056738 A1 | 3/2004 | Aiga et al. | |
| 2007/0182502 A1 * | 8/2007 | Shin et al. | ................... 331/167 |

FOREIGN PATENT DOCUMENTS

| DE | 890194 | 9/1953 |
| EP | 1 298 445 A2 | 4/2003 |
| JP | 8-222916 | 8/1996 |
| WO | WO 98/27643 | 6/1998 |

OTHER PUBLICATIONS

Y. Sun et al., "A Fully Integrated Dual-Frequency Push-Push VCO for 5.2 and 5.8 GHz Wireless Applications", Microwave Journal, 2001, Apr., pp. 64, 66, 68, 70, 72, 74.

Kurt Leucht, "Electrical Principles of Radio", Handbook for specialized instruction and individual study, Franzis Verlag, Munich, 1957, pp. 206-220.

Wu H et al.: "Differential 4-tap and 7-tap transverse filters in SiGe for 10Gb/s multimode fiber optic link equalization", Digest of Technical Papers ISSCC 2003 Feb. 2003, pp. 1-10.

* cited by examiner

*Primary Examiner*—Robert Pascal
*Assistant Examiner*—Ryan J. Johnson
(74) *Attorney, Agent, or Firm*—Muncy, Geissler, Olds & Lowe, PLLC

(57) ABSTRACT

An integrated resonance circuit is provided for providing a high-frequency output signal, comprising a first output for providing a first high-frequency output signal with a first frequency and a first amplitude, a first inductive unit connected to the first output, and a first capacitive unit connected to the first output. According to the invention, a second output for providing a second high-frequency output signal with a second frequency and a second amplitude is provided, whereby the second frequency matches the first frequency and the second amplitude differs from the first amplitude, and a second inductive unit, connected to the first output and to the second output, and a second capacitive unit, connected to the second output, are provided. The invention relates furthermore to a voltage-controlled oscillator and to an integrated circuit.

19 Claims, 3 Drawing Sheets

INTEGRATED RESONANCE CIRCUIT

This nonprovisional application claims priority under 35 U.S.C. § 119(a) to German Patent Application No. DE 102006023353, which was filed in Germany on May 17, 2006, and which is herein incorporated by reference.

BACKGROUND OF THE INVENTION

1. Field of the Invention

The present invention relates to an integrated resonance circuit. The invention relates furthermore to a voltage-controlled oscillator and to an integrated circuit.

2. Description of the Background Art

The invention falls within the field of integrated circuits (IC). It falls particularly within the field of integrated resonance circuits for providing a high-frequency output signal with a predefined (target) frequency. Resonance circuits of this type are used in many cases in high-frequency circuit arrangements (radio frequency, RF), such as voltage-controlled oscillators, amplifiers, filters, amplitude controllers, tuners, etc., in transmitting/receiving devices of telecommunication systems.

U.S. Pat. No. 6,778,022 B1 discloses a resonance circuit with an inductor and a capacitor (FIG. 2A), which at an output provides an output signal with a predefined frequency.

It is a disadvantage here that the properties of the resonance circuit, such as, e.g., the effective quality and/or the frequency stability, deteriorate at higher amplitudes of the output signal, i.e., in large-signal operation. A further disadvantage is the load on the resonance circuit by post-connected output signal buffers and the possibly necessary active damping of the output signal.

SUMMARY OF THE INVENTION

It is therefore an object of the present invention to provide integrated resonance circuits, which are simple and cost-effective to implement, and voltage-controlled oscillators, which have improved properties during large-signal operation, so that it is possible to realize powerful integrated circuits with the saving of effort.

The integrated resonance circuit of the invention for providing a high-frequency output signal comprises (A) a first output for providing a first high-frequency output signal with a first frequency and a first amplitude, (B) a first inductive unit, connected to the first output, and a first capacitive unit, connected to the first output, (C) a second output for providing a second high-frequency output signal with a second frequency and a second amplitude, whereby the second frequency matches the first frequency and the second amplitude differs from the first amplitude, and (D) a second inductive unit, connected to the first output and to the second output, and a second capacitive unit, connected to the second output.

The voltage-controlled oscillator of the invention can have at least one such resonance circuit.

The integrated circuit of the invention can have at least one such resonance circuit and/or at least one such voltage-controlled oscillator.

The essence of the invention is to provide, in addition to a first resonance circuit stage with a first output for providing a first output signal with a first amplitude, a second resonance circuit stage with a second output for providing a second output signal with the same frequency but a different second amplitude, whereby the second resonance circuit stage has a second inductive unit, connected to both outputs, and a second capacitive unit, connected to the second output. The effective quality of the resonance circuit and the constancy of the frequency during large-signal operation are advantageously increased in this way. Furthermore, this enables reducing the load on the resonance circuit by post-connected output signal buffers. An optionally necessary active damping of the output signal is advantageously eliminated. In addition, this enables improvement of the tunability of the resonance circuit.

In an embodiment of the resonance circuit of the invention, a third resonance circuit stage with a third output for providing a third output signal of the same frequency but a different third amplitude is provided, whereby the third resonance circuit stage has a third inductive unit, connected to the second and the third output, and a third capacitive unit, connected to the third output. Especially high resonance circuit qualities and/or an especially high constancy of the frequency during large-signal operation can be achieved advantageously in this manner. Furthermore, the load on the resonance circuit by post-connected output signal buffers can be further reduced. Moreover, this enables further improvement of the tunability of the resonance circuit.

In another embodiment of the resonance circuit of the invention, at least one of the capacitive units has an adjustable capacitance value and the resonance circuit is designed to set the settable capacitance value as a function of at least one control signal. The tunability of the resonance circuit is improved by this measure.

Another embodiment deals with a parasitic capacitance in at least one of the capacitive units. This type of resonance circuit is especially simple to implement.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
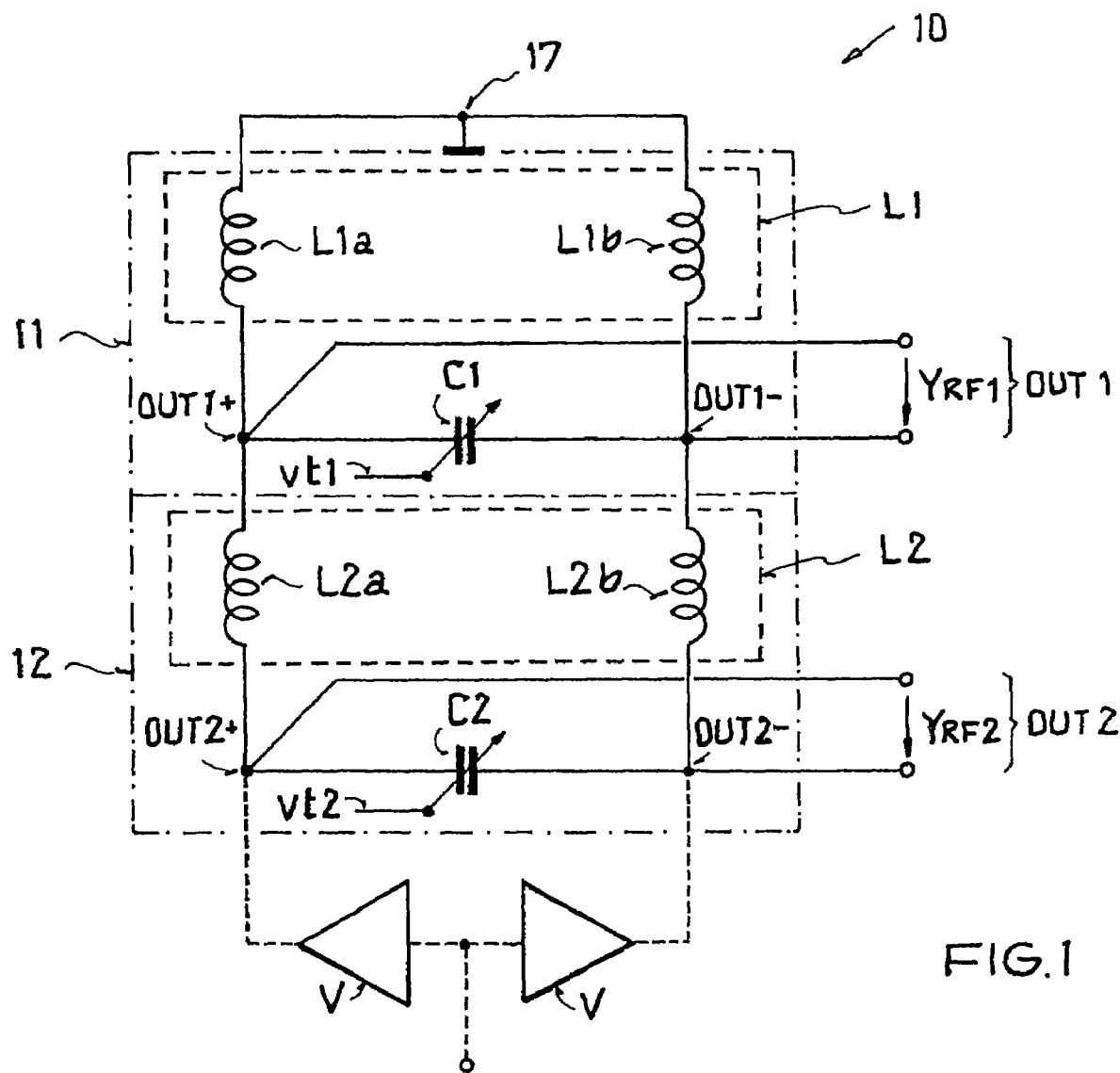
FIG. 1 shows a first exemplary embodiment of a resonance circuit of the invention.

In the figures, the same and functionally identical elements and signals, if not specified otherwise, are provided with the same reference characters.

FIG. 1 shows a circuit diagram of a first exemplary embodiment of an integrated resonance circuit of the invention.

Resonance circuit 10 has a first stage 11 for providing a first high-frequency output signal yRF1 and a second stage 12 for providing a second high-frequency output signal yRF2. First stage 11 has a first inductive unit L1, a first capacitive unit C1 connected to unit L1, and a first output OUT1 connected to both units L1, C1, for providing the first output signal yRF1. Second stage 12 has a second inductive unit L2 connected to first output OUT1, a second capacitive unit C2 connected to the unit L2, and a second output OUT2 connected to both units L2, C2, for providing the second output signal yRF2. The series connection of the two units L2, C2 is connected parallel to capacitive unit C1.

Preferably, the resonance circuit of the invention—as shown in FIG. 1—is realized differentially. It has differential outputs OUT1 and OUT2 with two terminals each OUT1+, OUT1− or OUT2+, OUT2−, at which the differential signal yRF1 or yRF2 is tapped. The noninverting terminal OUT1+ is connected to a first terminal of unit L1 and to a first terminal of unit C1, whereas the inverting terminal OUT1− is connected to another (second) terminal of units L1, C1 in each case. The noninverting terminal OUT2+ is connected to a first terminal of unit L2 and a first terminal of unit C2, whereas the inverting terminal OUT2− is connected to another (second) terminal of units L2, C2 in each case.

In the differential embodiment of the resonance circuit, second inductive unit L2 has two inductive subelements L2a, L2b, whose inductance values substantially match (i.e., within the scope of tolerances), whereby first subelement L2a is connected between the noninverting terminals OUT2+, OUT1+ and second subelement L2b between the inverting terminals OUT2−, OUT1−. As a result, a series connection of subelements L2a, L2b and capacitive unit C2 is connected parallel to capacitive unit C1. If first inductive unit L1 is also divided into two inductive subelements L1a, L1b with substantially matching inductance values, a so-called AC ground (virtual ground) becomes established at their connecting point 17.

In another embodiment, the resonance circuit of the invention is made non-differential (single ended).

The high-frequency output signals yRF1 and yRF2, provided by resonance circuit 10 with appropriate excitation, have the same frequency f0, for example, in the gigahertz range. Preferably, at least one of the capacitive units has a settable capacitance value, which is set with the use of at least one control signal, for setting the frequency f0 to a predefined target frequency (e.g., in the range of 10 GHz to 14 GHz).

According to FIG. 1, both capacitive units C1, C2 have a settable capacitance value, whereby the capacitance value of unit C1 is set with the use of at least one control signal vt1 and the capacitance value of unit C2 by at least one control signal vt2 in such a way that the frequency f0 of the output signals yRF1, yRF2 assumes the predefined target value.

Capacitive units C1, C2 can have, for example, a unit with a continuously variable capacitance value, such as, e.g., a varactor, capacitive, or MOS diode (metal oxide semiconductor) or a MEM varactor (microelectromechanical) and/or a unit with a stepwise variable capacitance value, which is made, e.g., as a switched MIM capacitor (metal-insulator-metal), switched polycap, or as a switched capacitor bank (capacitive digital-analog converter, CDAC). Preferably, capacitive unit C1 has a varactor diode and capacitive unit C2, a switched capacitor bank (CDAC). Alternatively, one of the capacitive units or both units C1, C2 can have a fixed capacitance value. In another embodiment, capacitive unit C1 or C2 is a parasitic capacitor, e.g., of amplification elements with which the resonance circuit of the invention is used, e.g., in a voltage-controlled oscillator.

Inductive units L1, L2 or inductive subelements L1a, L1b, L2a, L2b are preferably designed as traces arranged in one or more metallization levels of an integrated circuit. Alternatively, individual or several of these inductive elements can also be bond wires or other connecting means, such as, e.g., small solder balls, flip-chip junctions, etc.

The amplitude of the first output signal yRF1 is designated by A1 and its frequency by f1 below. Analogous to this, A2 and f2 designate the corresponding values of the second output signal yRF2.

The output signals yRF1 and yRF2 have matching frequencies (f1=f2=f0). They differ, however, in their amplitude, whereby the amplitude A2 of yRF2 exceeds the amplitude A1 of yRF1.

The amplitude values A1 and A2 hereby depend on the inductance values L1a=L1b, L2a=L2b and the capacitance values C1, C2. In the exemplary case, C1=C2 and L1a=L2a, for example, an amplitude ratio of about A1/A2=0.55 is obtained.

Because output signals are provided which differ in their amplitude, the resonance circuit of the invention offers a variety of advantages.

In contrast to a simple parallel resonance circuit of an inductor and a parallel-connected capacitor, in the resonance circuit of the invention, the total amplitude (A2) of the output voltage declines across only one part (in FIG. 1: C2) of the total resonance circuit capacitor, whereas only the reduced amplitude (A1) declines across the remaining part of the resonance circuit capacitor (in FIG. 1: C1). Similarly, the complete current flows only across part of the entire resonance circuit inductor (L1). This is important because the quality of the integrated elements also depends on their modulation. Thus, e.g., varactor diodes have a continuously decreasing quality with increasing modulation (voltage amplitude), whereas the quality, e.g., in switched MIM capacitors substantially remains constant up to a certain modulation limit (amplitude limit) and declines drastically above this limit. By operating elements with the modulation that is optimal in this regard, the effective quality of the resonance circuit can therefore be increased advantageously in that, e.g., capacitive unit C1 is designed as a varactor diode and is operated with the smaller amplitude A1, whereas capacitive unit C2 is designed as a switched MIM capacitor and is operated with the higher amplitude A2, but nevertheless below the indicated modulation limit. Capacitive elements with improved large-signal properties can be operated in this way advantageously with higher amplitudes and those with poorer large-signal properties with lower amplitudes.

Furthermore, the capacitance value, e.g., of an integrated diode varies the more greatly, the higher the amplitude of the reverse voltage across the diode. This undesirable effect as well is advantageously reduced by the resonance circuit of the invention in that a voltage with a reduced amplitude (A1) is applied at a portion of the total resonance circuit capacitor (in FIG. 1: C1).

In addition, the provision of output signals with different amplitudes makes it possible to use several output signals of different amplitudes in subsequent circuit arrangements or to use or to select the signal that is most suitable for the subsequent circuit arrangement and/or resonance circuit. Thus, (optionally active) units for signal attenuation are advantageously eliminated, e.g., by providing an output signal with a lower amplitude. In addition, e.g., the load on the resonance circuit by post-connected output signal buffers can be advantageously minimized or adapted in that an output signal with an amplitude optimal in this regard (e.g., smaller) is used.

In an advantageous embodiment, e.g., switching elements are provided which permit switching during operation between the first output signal yRF1 and the second output signal yRF2, so that the signal "optimal" in each case is processed further.

An exemplary dimensioning of elements of resonance circuit 10 of FIG. 1, according to the invention, is described below. In this case, a simple parallel resonance circuit is used as a starting point, which has a capacitor with a capacitance value C and a parallel-connected inductive unit, which includes two series-connected inductive subelements with matching inductance values La=Lb. This type of parallel resonance circuit provides precisely one output signal yRF with a frequency f0, for which the following relationship applies:

$$(2\pi * f0)^2 = 1/(2 * La * C). \quad (1)$$

Resonance circuit 10 of FIG. 1 of the invention provides output signals yRF1 and yRF2 with the same frequency value f0, when the four inductive subelements L1a, L1b, L2a, L2b and both capacitive units C1, C2, for example, are dimensioned as follows:

$$L1a = L1b \approx (2/6) * La = La/3, \quad (2)$$

$$L2a = L2b \approx (5/6) * La, \quad (3)$$

$$C1 = C2 = (3/5) * C \quad (4)$$

It is evident from equations (2) to (4) that, in this dimensioning example, neither the sum of the inductance values L_tot nor the sum of the capacitance values C_tot of the resonance circuit of the invention agrees with the sum of the inductance or capacitance values of the simple parallel resonance circuit. The sum of the inductance values assumes the value according to equations (2) and (3)

$$L\_tot = 2 * (L1a + L2a) = 2 * (7/6) * La \quad (5)$$

and thereby a higher inductance value than in a simple parallel resonance circuit (2*La). The sum of the capacitance value according to equation (4) with the value $$c\_tot = C1 + C2 = (6/5) * C \quad (6)$$

is also above the value C in the simple parallel resonance circuit.

The dimensioning of resonance circuit 10 according to equations (2)-(4) is understood to be exemplary. In analogy to a simple parallel resonance circuit, it is possible in particular to increase the inductance values and to reduce the capacitance values (or vice versa) while keeping the resulting frequency f0 constant.

Even when the value of C_tot is kept constant, the sum of inductance values L_tot of resonance circuit 10 exceeds the value 2*La of the simple parallel resonance circuit, so that advantageously even with an unchanged tunability of the resonance circuit an output signal (yRF2) can be provided with an increased amplitude (A2) in comparison with the simple parallel resonance circuit.

If resonance circuit 10 of FIG. 1 is used as part of a voltage-controlled oscillator (VCO), additional, e.g., amplification elements V, connected to the second output OUT2, are provided, which are shown by the dashed line in FIG. 1. These amplification elements (e.g., transistors) compensate for the losses in the resonance circuit so that the amplitudes of the output signals yRF1 and yRF2 do not decline but remain constant over time. In alternative embodiments of the VCO, the amplification elements V are connected to the first output OUT1.

Figure 2:
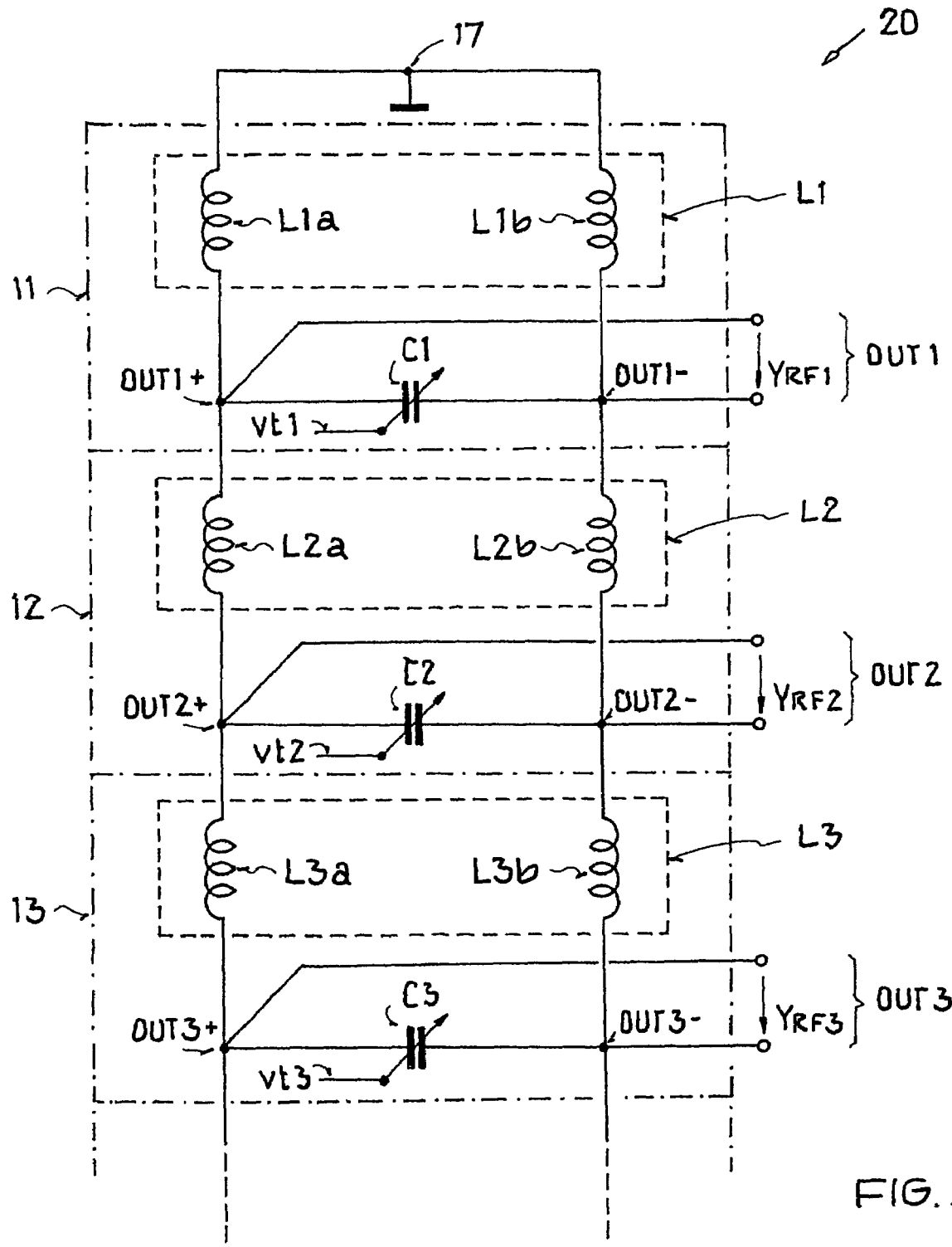
FIG. 2 a second exemplary embodiment of a resonance circuit of the invention.

FIG. 2 shows a circuit diagram of a second exemplary embodiment of an integrated resonance circuit of the invention.

In addition to the first and second stage 11 or 12, which are designed in agreement with the aforementioned first exemplary embodiment, resonance circuit 20 has an additional third stage 13 for providing a third high-frequency output signal yRF3.

Third stage 13 has a third inductive unit L3 connected to second output OUT2, a third capacitive unit C3 connected to unit L3, and a third output OUT3 connected to the two units L3, C3, for providing the third output signal yRF3. The series connection of the two units L3, C3 is connected parallel to capacitive unit C2.

Output OUT3 in the preferred differential embodiment also has two outputs OUT3+, OUT3−, at which the differential signal yRF3 can be tapped. The noninverting terminal OUT3+ is connected to a first terminal of unit L3 and a first terminal of unit C3, whereas the inverting terminal OUT3− is connected to another (second) terminal of units L3, C3 in each case. Third inductive unit L3 as well has two inductive subelements L3a, L3b, whose inductance values match substantially, whereby the first subelement L3a is connected between the noninverting terminals OUT3+, OUT2+ and the second subelement L3b between the inverting terminals OUT3−, OUT2−. As a result, a series connection of subelements L3a, L3b and capacitive unit C3 is connected parallel to capacitive unit C2.

To set the frequency f0 to a predefined target frequency, preferably also the capacitive unit C3 has a settable capacitance value, which is set by using at least one control signal vt3. Preferably, capacitive unit C3 has a switched capacitor bank (CDAC), the capacitive unit C1 a varactor diode, and the capacitive unit C2 a parallel connection with a varactor diode and a switched capacitor bank.

Inductive unit L3 or inductive subelements L3a, L3b are preferably designed as traces arranged in one or more metallization levels of an integrated circuit. Alternatively, individual or several inductive elements may also be bond wires or other connecting means.

If the amplitude and frequency of the third output signal yRF3 are designated by A3 or f3, respectively, the signal yRF3 also has a frequency matching the signals yRF1 and yRF2. However, the signals yRF1, yRF2, and yRF3 differ in their amplitude, whereby the amplitude A3 of yRF3 exceeds the amplitude A2 of yRF2, so that the following applies: A3>A2>A1.

The amplitude values A1, A2, and A3 hereby depend on the inductance values L1a=L1b, L2a=L2b, L3a=L3b and the capacitance values C1, C2, and C3. In the exemplary case C1=C2=C3 and L1a=L2a=L3a, for example, an amplitude ratio of about A1/A3=0.44 and about A2/A3=0.8 is obtained.

In the second exemplary embodiment of the resonance circuit of the invention, the total amplitude (A3) of the output voltage also declines only over part (in FIG. 2: C3) of the total resonance circuit capacitor, whereas lower amplitudes (A1, A2) decline over the remaining part of the resonance circuit capacitor (in FIG. 2: C1, C2). Similarly, the complete current flows only across part of the entire resonance circuit inductor (L1). Depending on their large-signal properties, the elements in the second exemplary embodiment can be modulated even more precisely, i.e., with a finer amplitude resolution, so that especially high resonance circuit qualities and/or an especially high constancy of frequency result.

In addition, in subsequent circuit arrangements up to three output signals with different amplitudes can be used or the signal that is best suited for the subsequent circuit arrangement and/or resonance circuit can be selected. In an advantageous embodiment, e.g., switching elements are provided which permit switching during operation between output signals yRF1, yRF2, and yRF3, so that the signal "optimal" in each case is processed further.

In other exemplary embodiments, the resonance circuit of the invention has more than three stages, as is illustrated in FIG. 2 by the dashed lines emerging from terminals OUT3+, OUT3−. Each additional stage, which is configured similar to stages 11-13, provides an additional output signal with a different amplitude. The advantages mentioned with respect to the first and second exemplary embodiment also apply analogously to exemplary embodiments with more than three stages.

Figure 3:
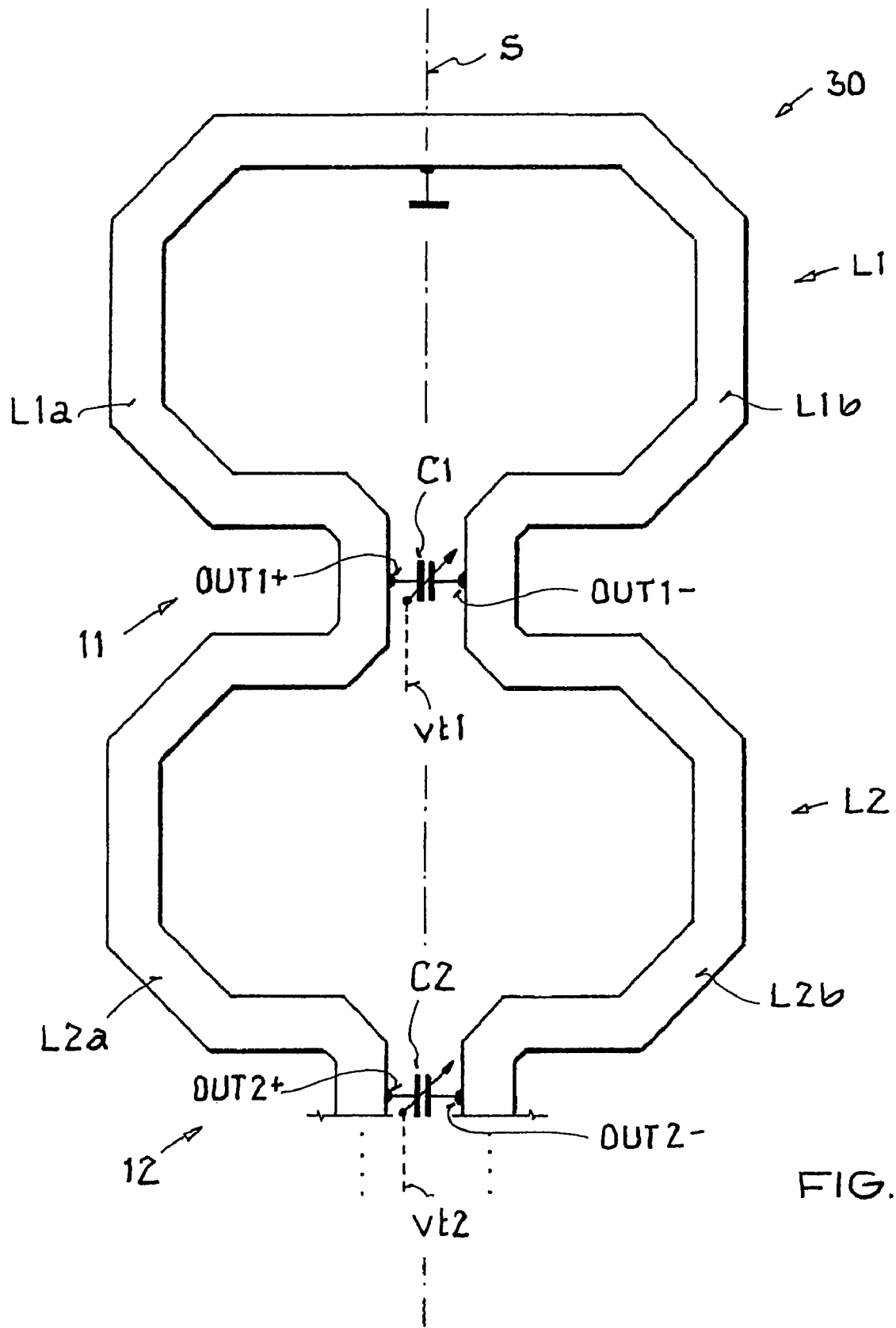
FIG. 3 a third exemplary embodiment of a resonance circuit of the invention (top plan view).

FIG. 3 shows schematically a layout of a third exemplary embodiment of a resonance circuit of the invention. The top plan view according to FIG. 3 corresponds to a detail from a horizontal cutting plane through an integrated circuit with a resonance circuit of the invention according to FIG. 1. Resonance circuit 30 has a first stage 11 and a second stage 12.

First stage 11 has a first conductor loop L1 forming the first inductive unit and a symbolically depicted first capacitive unit C1. Output OUT1 is located with its differential terminals OUT1+, OUT1− at both "ends" of conductor loop L1, which are connected to capacitive unit C1. The differential output signal yRF1 (not shown in FIG. 3) is provided at terminals OUT1+, OUT1−. First conductor loop L1 comprises a first trace section L1a and a second trace section L1b, which are connected to one another at one of their ends to a point that represents the AC ground. The other end of trace section L1a or L1b is connected to the terminal OUT1+ or OUT1−.

Second stage 12 has a second conductor loop L2, forming the second inductive unit and interrupted in its middle, with the two trace sections L2a, L2b and a second capacitive unit C2. Output OUT2 for providing the second output signal yRF2 is connected in turn to conductor loop L2 and capacitive unit C2, whereby first trace section L2a is connected between the noninverting terminals OUT1+, OUT2+ and second trace section L2b between the inverting terminals OUT1−, OUT2−. Both conductor loops L1, L2 are designed substantially symmetric to a cutting line designated by S.

According to FIG. 3, conductor loops L1, L2 are designed substantially identical. In other embodiments, the conductor loops differ in their radii, their trace widths, and/or their forms. Preferably, both the "radii" of the conductor loops and the widths of the traces become smaller from stage to stage (from top to bottom in FIG. 3). Furthermore, the conductor loops can also be made rectangular, square, oval, round, or with "rounded corners" instead of the quasi-octahedral form according to FIG. 3.

In other embodiments, trace sections L1a, L1b and/or L2a, L2b have one or more complete turns (loops), which are arranged in at least two metallization levels of the integrated circuit. The number of turns here can vary from stage to stage or remain constant.

The resonance circuit of the invention, described previously with reference to the exemplary embodiments, can be used advantageously in the most diverse applications in oscillator, resonator, amplifier, filter, tuner circuits, etc.

The resonance circuit of the invention or the mentioned circuits are each preferably a component of an integrated circuit, which, e.g., is made as a monolithically integrated circuit (e.g., application specific integrated circuit, ASIC, or application specific standard product, ASSP), as a hybrid circuit (thin- or thick-layer technology), or as a multilayer-ceramic circuit arrangement.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An integrated resonance circuit for providing a high-frequency output signal, the integrated resonance circuit comprising:
   a first output for providing a first high-frequency output signal with a first frequency and a first amplitude;
   a first inductive unit connected to the first output;
   a first capacitive unit connected to the first output;
   a second output for providing a second high-frequency output signal with a second frequency and a second amplitude, wherein the second frequency matches the first frequency and the second amplitude differs from the first amplitude;
   a second inductive unit connected to the first output and to the second output; and
   a second capacitive unit connected to the second output wherein the first and second outputs are provided to an external circuit.

2. The resonance circuit according to claim 1, wherein a series connection of the second inductive unit and the second capacitive unit is connected parallel to the first capacitive unit.

3. The resonance circuit according to claim 1, wherein the second inductive unit has two inductive subelements, each of which is connected to the first output and to the second output.

4. The resonance circuit according to claim 1, wherein the second amplitude is greater than the first amplitude.

5. The resonance circuit according to claim 1, further comprising:
   a third output for providing a third high-frequency output signal with a third frequency and a third amplitude, wherein the third frequency matches the first frequency and the third amplitude differs from the first amplitude and the second amplitude;
   a third inductive unit connected to the second output and to the third output; and
   a third capacitive unit connected to the third output.

6. The resonance circuit according to claim 5, wherein a series connection of the third inductive unit and the third capacitive unit is connected parallel to the second capacitive unit.

7. The resonance circuit according to claim 5, wherein the third inductive unit has two inductive subelements, each of which is connected to the second output and to the third output.

8. The resonance circuit according to claim 5, wherein the third amplitude is greater than the second amplitude.

9. The resonance circuit according to claim 1 wherein at least one of the inductive units has at least one conductor loop.

10. The resonance circuit according to claim 1, wherein at least one of the inductive units has at least one bond wire, a solder ball, or a flip-chip junction.

11. The resonance circuit according to any claim 1, wherein at least one of the capacitive units has a settable capacitance value and the resonance circuit is designed to set the settable capacitance value as a function of at least one control signal.

12. The resonance circuit according to claim 1, wherein at least one of the capacitive units has at least a metal-insulator-metal capacitor, a varactor, a switched MIM capacitor, or a switched capacitor bank.

13. The resonance circuit according to claim 1, wherein at least one of the capacitive units is a parasitic capacitor.

14. The resonance circuit according to claim 1, wherein the first inductive unit is designed as a conductor loop with one or more turns.

15. A voltage-controlled oscillator comprising at least one resonance circuit according to claim 1.

16. An integrated circuit having at least one resonance circuit according to claim 1.

17. The integrated circuit according to claim 16, wherein the integrated circuit is designed as a monolithically integrated circuit, as a hybrid circuit, or as a multilayer-ceramic circuit.

18. The resonance circuit according to claim 1, wherein the first and second outputs are directly connected to the external circuit.

19. An integrated resonance circuit for providing a high-frequency output signal, the integrated resonance circuit comprising:

a first output for providing a first high-frequency output signal with a first frequency and a first amplitude;
a first inductive unit connected to the first output;
a first capacitive unit connected to the first output;
a second output for providing a second high-frequency output signal with a second frequency and a second amplitude, wherein the second frequency matches the first frequency and the second amplitude differs from the first amplitude;
a second inductive unit connected to the first output and to the second output; and
a second capacitive unit connected to the second output, wherein the first and second outputs are provided to output buffers.

* * * * *